US 6,623,559 B2

(12) United States Patent
Huang

(10) Patent No.: US 6,623,559 B2
(45) Date of Patent: Sep. 23, 2003

(54) METHOD FOR THE PRODUCTION OF SEMICONDUCTOR QUANTUM PARTICLES

(75) Inventor: Wen-Chiang Huang, Auburn, AL (US)

(73) Assignee: Nanotek Instruments, Inc., Fargo, ND (US)

(*) Notice: Subject to any disclaimer, the term of this patent is extended or adjusted under 35 U.S.C. 154(b) by 85 days.

(21) Appl. No.: 10/007,562

(22) Filed: Dec. 10, 2001

(65) Prior Publication Data

US 2003/0116080 A1 Jun. 26, 2003

(51) Int. Cl.⁷ ................................................ C30B 23/08
(52) U.S. Cl. ......................... 117/87; 117/84; 117/103; 117/105; 117/108; 117/953
(58) Field of Search .............................. 117/84, 87, 103, 117/105, 108, 953

(56) References Cited

U.S. PATENT DOCUMENTS

| | | |
|---|---|---|
| 3,988,084 A | 10/1976 | Esposito et al. |
| 4,282,195 A | 8/1981 | Joekie |
| 4,490,162 A | 12/1984 | Davis |
| 5,125,574 A | 6/1992 | Anderson et al. |
| 5,505,928 A | 4/1996 | Alivisatos et al. |
| 5,525,377 A | 6/1996 | Gallagher et al. |
| 5,537,000 A | 7/1996 | Alivisatos et al. |
| 5,585,640 A | 12/1996 | Huston |
| 5,656,061 A | 8/1997 | Miller et al. |
| 5,751,018 A | 5/1998 | Alivisatos et al. |
| 5,770,172 A | 6/1998 | Linehan et al. |
| 5,863,618 A | 1/1999 | Jarosinsk et al. |
| 5,882,779 A | 3/1999 | Lawandy |
| 5,906,670 A * | 5/1999 | Dobson |
| 5,985,353 A | 11/1999 | Lawton |
| 5,990,479 A | 11/1999 | Weiss et al. |
| 6,042,628 A | 3/2000 | Nishikiori et al. |
| 6,090,200 A | 7/2000 | Gary et al. |
| 6,106,609 A | 8/2000 | Yang |
| 6,114,038 A | 9/2000 | Castro et al. |
| 6,194,213 B1 | 2/2001 | Barbera-Guillem |
| 6,207,229 B1 | 3/2001 | Bawendi et al. |
| 6,207,392 B1 | 3/2001 | Weiss et al. |
| 6,225,198 B1 | 5/2001 | Alivisatos et al. |
| 6,235,540 B1 | 5/2001 | Siiman et al. |
| 6,251,303 B1 | 6/2001 | Bawendi et al. |

OTHER PUBLICATIONS

Choy, Processing structure property of nanorystalline materials produced using novel and cost effective ESAVD based method, MAterials Science and Engineering C, vol. C16(1–2) pp. 139–145.*

Deppert et al., "Aersol fabrication of nanocrystals of InP and related materials", Conference Proceedings 1998 International Conference on Indium Phosphide and related Materials, IEEE MAy 1998 pp. 765–768.*

\* cited by examiner

Primary Examiner—Robert Kunemund

(57) ABSTRACT

A method for producing compound semiconductor quantum particles from at least a metallic element selected from Groups IIA, IIB, IIIA, IVA, and VA of the Periodic Table and at least a non-oxygen reactant element selected from the group consisting of P, As, S, Se, and Te. The method includes: (a) operating a heating and atomizing means to provide a stream of super-heated fine-sized fluid droplets of a selected metallic element into a reaction chamber; (b) directing a stream of a reactant element-containing fluid medium into the chamber to impinge upon and react with the super-heated metal fluid droplets to form substantially nanometer-sized phosphide, arsenide, sulfide, selenide, and/or telluride compound particles; and (c) cooling and/or passivating the compound particles to form the desired compound semiconductor quantum particles. These quantum particles are particularly useful for photo luminescence and biological labeling applications.

23 Claims, 6 Drawing Sheets

METHOD FOR THE PRODUCTION OF SEMICONDUCTOR QUANTUM PARTICLES

The present invention is a result of a research sponsored by the SBIR Program of U.S. National Science Foundation. The U.S. government has certain rights on this invention.

FIELD OF THE INVENTION

The present invention relates to a method for producing nanometer-sized semiconductor particles, and more particularly, it relates to a method for producing quantum-sized compound semiconductor particles (diameter smaller than 20 nm or 200 Å) at a high production rate.

BACKGROUND

Nanometer-sized semiconductor crystallites or "quantum dots" whose radii are smaller than the bulk exciton Bohr diameter (up to 20 nm, but normally smaller than 10 nm in radius) represent a class of materials intermediate between molecular and bulk forms of matter. Quantum confinement of both the electron and hole in all three dimensions leads to an increase in the effective band gap of the semiconductor-material with decreasing crystallite size. As a result, both the optical absorption and emission of quantum dots shift to the higher energies (blue shift) as the size of the dots gets smaller. Nanometer-sized semiconductor crystallites that show such a quantum size effect are also referred to as quantum-sized crystals. They include I–VII, II–VI, III–V, III–VI and IV–VI compound semiconductors. As compared to I–VII and II–VI groups, the III–V semiconductor nano crystals have been studied to a lesser extent possibly due to the numerous difficulties encountered in the preparation of this class of nano crystals. However, as compared to the I–VII and I–VI semiconductors, the III–V materials have a greater degree of covalent bonding, a less ionic lattice, and larger exciton diameters (e.g., the exciton diameter in GaAs is 19 nm, compared to 6 nm for CdS). For this reason, the quantum size effect on the optical spectra has been predicted to be more pronounced in the III–V class of materials than in the II–VIs.

Quantum-sized compound semiconductors have been found to provide an electro-luminescent device capable of emitting light of various visible wavelengths in response to, external stimulus. In such an electro-luminescent device, variations in voltage could result in change of color of the light emitted by the device. Since these three classes of light emitting materials are inorganic materials, they are capable of withstanding higher temperatures than the conventional organic polymeric materials for light-emitting applications.

Fluorescent labeling of biological systems is a well known analytical tool used in modern biotechnology as well as analytical chemistry. Applications for such fluorescent labeling include technologies such as medical fluorescence microscopy, histology, flow cytometry, fluorescence in-situ hybridization for medical assays and research, DNA sequencing, immuno-assays, binding assays, separation, etc. Quantum-sized semiconductor crystals have been found to provide stable probe materials for biological applications having a wide absorption band. These crystals are capable of exhibiting either a detectable change in absorption or of emitting radiation in a narrow wavelength band, without the presence of the large red emission tails characteristic of dye molecules. This feature makes it possible to permit the simultaneous use of a number of such probe materials, each emitting light of a different narrow wavelength band and/or being capable of scattering or diffracting radiation. These stable probe materials can be used to image the same sample by both light and electron microscopy.

The following patents are believed to represent the state of the art of semiconductor quantum particles:
1. S. Weiss, et al., "Semiconductor nanocrystal probes for biological applications and process for making and using such probes," U.S. Pat. No. 6,207,392 (Mar. 27, 2001).
2. A. P. Alivisatos, et al., "Process for forming shaped group II–VI semiconductor nanocrystals, and product formed using process," U.S. Pat. No. 6,225,198 (May 1, 2001).
3. A. P. Alivisatos, et.al., "Preparation of III–V semiconductor Nanocrystals," U.S. Pat. No. 5,505,928 (Apr. 9, 1996).
4. A. P. Alivestos, et al., "Electroluminescent devices formed using semiconductor nanocrystals and an electron transport media and method of making such electroluminiscent devices," U.S. Pat. No. 5,537,000 (Jul. 16, 1996).
5. S. Weiss, et al., "Organic luminescent semiconductor nanocrystal probes for biological applications and process for making and using such probes," U.S. Pat. No. 5,990,479 (Nov. 23, 1999).
6. A. P. Alivestos, et al., "Semiconductor nanocrystals covalently bound to solid inorganic surfaces using self-assembled monolayers," U.S. Pat. No. 5,751,018 (May 12, 1998).
7. M. G. Bawendi, et al., "Water-soluble fluorescent nanocrystals," U.S. Pat. No. 6,251,303 (Jun. 26, 2001).
8. M. G. Bawendi, et al., "Highly luminescent color-selective materials and method of making thereof," U.S. Pat. No. 6,207,229 (Mar. 27, 2001).
9. N. M. Lawandy, "Semiconductor nanocrystal display materials and display apparatus employing same," U.S. Pat. No. 5,882,779 (Mar. 16, 1999).
10. A. L. Huston, "Glass matrix doped with activated luminiscent nanocrystalline particles," U.S. Pat. No. 5,585,640 (Dec. 17, 1996).
11. H. F. Gray, et al. "Nanoparticle phosphors manufactured using the bicontinuous cubic phase process," U.S. Pat. No. 6,090,200 (Jul. 18, 2000).
12. J. Yang, "Formation of nanocrystalline semiconductor particles within a bicontinuous cubic phase," U.S. Pat. No. 6,106,609 (Aug. 22, 2000).
13. S. L. Castro, et al., "Functionalized nanocrystals and their use in detection systems," U.S. Pat. No. 6,114,038 (Sep. 5, 2000).
14. E. Barbera-Guillem, "Lipophilic, functionalized nanocrystals and their use for fluorescence labeling of membranes," U.S. Pat. No. 6,194,213 (Feb. 27, 2001).
15. D. Gallagher, et al., "Method of manufacturing encapsulated doped particles," U.S. Pat. No. 5,525,377 (Jun. 11, 1996).
16. C. Lawton, "Biomolecular synthesis of quantum dot composites," U.S. Pat. No. 5,985,353 (Nov. 16, 1999).
17. O. Siiman, et al., "Semiconductor nanoparticles for analysis of blood cell populations and method of making same," U.S. Pat. No. 6,235.,540 (May 22, 2001).
18. J. C. Linehan, et al. "Process of forming compounds using reverse micelle for reverse microemulsion systems," U.S. Pat. No. 5,770,172 (Jun. 23, 1998).

Bawendi and co-workers have described a method of preparing monodisperse semiconductor nanocrystallites by pyrolysis of organometallic reagents injected into a hot coordinating solvent [Ref.8]. This permits temporally discrete nucleation and results in the controlled growth of macroscopic quantities of nanocrystallites. Size selective precipitation of the crystallites from the growth solution provides crystallites with narrow size distributions. The narrow size distribution of the quantum dots allows the possibility of light emission in very narrow spectral widths. Although semiconductor nanocrystallites prepared as described by Bawendi and co-workers exhibit near monodispersity, and hence, high color selectivity, the luminescence properties of the crystallites are poor. Such crystallites exhibit low photoluminescent yield, that is, the light emitted upon irradiation is of low intensity. This is due to energy levels at the surface of the crystallite which lie within the energetically forbidden gap of the bulk interior. These surface energy states act as traps for electrons and holes which degrade the luminescence properties of the material.

Since mid-1980's, various synthetic approaches have been developed in preparing nano-sized II–VI (Zn and Cd chalcogenides) and IV–VI (Pb chalcogenides) semiconductors. Much of this effort has been aimed at achieving a very narrow particle size distribution. The basic idea is to use the spatial or chemical confinement provided by matrices or organic capping molecules to terminate the growth of nanocrystallites at any desired stage. In most cases, lack of a microscopically uniform environment in the substrates might be the cause for relatively wide size distribution. Both organic and inorganic matrices, such as monolayers, polymers, inverse micelles, and zeolites have been used to control the particle size. Recently, other researchers have obtained mono-dispersed CdSe nano crystallites based on the pyrolysis of organometallic reagents. This approach makes use of the concept of Ostwald ripening for size selective precipitation of nano crystallites. So far, many efforts have been made to synthesize quantum-sized II–VI semiconductors especially on the $CdS_xSe_{1-x}$ systems, while much fewer efforts on IV–VI (PbX, X=S, Se, Te) compounds have been reported. The IV—VI group of compound semiconductors exhibits smaller band gaps, greater quantum-size effect and larger optical non-linearity compared to II–VI materials.

Conventional wet chemistry synthesis performed without matrix assistance tends to result in the production of micron size particles. Various host matrices, such as glass, zeolites, sol-gels, and micelles, have been used to synthesize nano particles. However, a number of problems have been found to be associated with these methods. For instance, the particles synthesized in glasses and sol-gels exhibit large polydispersity, since they are not ordered structures. Another disadvantage with these methods is the inability to easily isolate the nano particles from the matrix material. In the case of micelles, even though it is possible to isolate the particles, the low precursor concentrations required will make mass production of nano particles expensive or impractical.

Semiconductor nano crystals, such as Group II–VI nano crystals may be formed by dissolving a Group II precursor and a Group VI precursor in a solvent and then applying heat to the resulting solution. For example, Group II–VI semiconductor nano crystals may be formed by dissolving a dialkyl of the Group II metal and a Group VI powder in a trialkyl phosphine solvent at ambient temperature, and then injecting the mixture into a heated (340°–360° C.) bath of tri-octyl phosphine oxide (TOPO). While the above process is capable of producing Group II–VI semiconductor nano crystals, the results can be somewhat erratic in terms of average particle size and size distribution. This problem of not being reproducible is likely due to the impurities in the technical grade (90% pure) TOPO that adversely influence the reaction. However, substitution of pure TOPO for the technical grade TOPO has also been unsatisfactory, particularly when control of the shape of the particle growth is also desired, clearly because the pure TOPO binds too weakly to the growing crystallites and only weakly associates with the Group II metal to act as a growth retardant, resulting in the growth of spheres rather than any other desired shapes. It seems that the presence of impurities in the technical grade TOPO results in the erratic success of Group II–VI semiconductor nanocrystal growth in technical grade TOPO.

Alivisatos et al. [Ref.3] describes a process for forming Group III–V semiconductor nano crystals wherein size control is achieved through use of a crystallite growth terminator which controls the size of the growing crystals. Crystallite growth terminators are said to include a nitrogen-containing or a phosphorus-containing polar organic solvent having an unshared pair of electrons. The patent further states that this growth terminator can complex with the metal and bind to it, thereby presenting a surface which will prevent further crystal growth.

Since various groups of compound semiconductor nano crystals are of interest for use in optical displays, as well as in biological applications, it would be desirable to provide a process for mass-producing these semiconductor nano crystals wherein the particle size, growth rate, and particle size distribution can be reproducibly controlled.

The techniques for the generation of nanometer-sized particles may be divided into three broad categories: vacuum, gas-phase, and condensed-phase synthesis. Vacuum synthesis techniques include sputtering, laser ablation, and liquid-metal ion sources. Gas-phase synthesis includes inert gas condensation, oven sources (for direct evaporation into a gas to produce an aerosol or smoke of clusters), laser-induced vaporization, laser pyrolysis, flame hydrolysis, and combustion synthesis. Condensed-phase synthesis includes reduction of metal ions in an acidic aqueous solution, liquid phase precipitation of semiconductor clusters, and decomposition-precipitation of ionic materials for ceramic clusters. Other methods include high-energy milling, mix-alloy processing, chemical vapor deposition (CVD), and sol-gel techniques.

All of these techniques have one or more of the following problems or shortcomings:

(1) Most of these prior-art techniques suffer from a severe drawback: extremely low production rates. It is not unusual to find a production rate of several grams a day. Vacuum sputtering, for instance, only produces small amounts of particles at a time. Laser ablation and laser-assisted chemical vapor deposition techniques are well-known to be excessively slow processes. The high-energy ball milling method, known to be a "quantity" process, is capable of producing only several kilograms of nano-scaled powders in approximately 100 hours. These low production rates, resulting in high product costs, have severely limited the utility value of nano-phase materials. There is, therefore, a clear need for a faster, more cost-effective method for preparing nanometer-sized powder materials.

(2) Condensed-phase synthesis such as direct reaction of metallic element with a reactant to produce compound semiconductor powder requires pre-production of metallic element of high purity in finely powdered form. This reaction tends to produce a compound powder product which is constituted of a broad particle size distribution. Furthermore, this particular reaction does not yield a product powder finer than 100 nm (nanometers) except with great difficulty. Due to the limited availability of pure metallic element in finely powdered form, the use of an impure metallic powder necessarily leads to an impure compound semiconductor product.

(3) Some processes require expensive precursor materials to semiconductor powders and could result in harmful by-product that has to be properly disposed of.

(4) Most of the prior-art processes are capable of producing a particular type of compound powder at a time, but do not permit the preparation of a uniform mixture of two or more types of nano-scaled ceramic powders at a predetermined proportion.

(5) Most of the prior-art processes require heavy and/or expensive equipment (e.g., a high power laser source and high vacuum equipment), resulting in high production costs. In the precipitation of ultra fine particles from the vapor phase, when using thermal plasmas or laser beams as energy sources, the particle sizes and size distribution cannot be precisely controlled. Also, the reaction conditions usually lead to a broad particle size distribution as well as the appearance of individual particles having diameters that are multiples of the average particle size.

(6) The conventional mechanical attrition and grinding processes have the disadvantages that powders can only be produced up to a certain fineness and with relatively broad particle-size distribution. As a matter of fact, with the currently familiar large-scale process for manufacturing powders it is rarely possible, or only possible with considerable difficulty, to produce powders having average particle sizes of less than 0.5 $\mu$m (microns).

A relatively effective technique for producing fine metal particles is atomization. Atomization involves the breakup of a liquid into small droplets, usually in a high-speed jet. The breakup of a liquid stream by the impingement of high-pressure jets of water or gas is referred to as water or gas atomization, respectively. Other commonly used atomization techniques include centrifugal atomization, vacuum atomization, and ultrasonic atomization. By judiciously varying the parameters of the atomization process, the particle size, particle size distribution, particle shape, chemical composition and micro-structure of the particles can be varied to meet the requirements of a specific application.

The major components of a typical atomization system include a melting chamber (including a crucible, a heating devices and a melt-guiding pipe) in a vacuum or protective gas atmospheres an atomizing nozzle and chamber, and powder-drying (for water atomization) or cooling equipment. The metal melt can be poured into first end of a guiding pipe having a second end with a discharging nozzle. The nozzle, normally located at the base of the pipe, controls the shape and size of the metal melt stream and directs it into an atomizing chamber in which the metal stream (normally a continuous stream) is disintegrated into fine droplets by the high-speed atomizing medium, either gas or water. Liquid droplets cool and solidify as they settle down to the bottom of the atomizing chamber. This chamber may be purged with an inert gas to minimize oxidation of the powder. A subsequent collector system may be used to facilitate the separation (from the waste gas) and collection of powder particles.

When a stream of metal melt is broken up into small droplets, the total surface energy of the melt increases. This is due to the fact that the creation of a droplet necessarily generates a new surface and every surface has an intrinsic surface tension. When droplets are broken down into even smaller droplets, the total surface area of the droplets is further increased, given the same volume of material. This implies that a greater amount of energy must be consumed in creating this greater amount of surface area. Where does this energy come from? An atomizer works by transferring a portion of the kinetic energy of a high-speed atomizing medium to the fine liquid droplets. Because of the recognition that the kinetic energy (K.E.) of a medium with a mass m and velocity v is given by K.E.=½ m v$^2$, prior-art atomization technologies have emphasized the importance of raising the velocity of the atomizing medium when exiting an atomizing nozzle. In an industrial-scale atomizer jet nozzle, the maximum velocity of a jetting medium is limited, typically from 60 feet/sec to supersonic velocities. The latter high speeds can only be achieved with great difficulties, by using heavy and expensive specialty equipment. In most of the cases, low atomizing medium speeds led to excessively large powder particles (micron sizes or larger).

The effect of temperature on the surface tension of metal melt droplets has been largely overlooked in the prior-art atomization technologies. Hitherto, the metal melts to be atomized for the purpose of producing fine metal powders have been typically super-heated to a temperature higher than the corresponding melting point by an amount of 70 to 300° C. (135 to 572° F.); e.g., as indicated in U.S. Pat. No. 5,863,618 (Jan. 26, 1999) issued to Jarosinsky, et al. It is important to recognize that the higher the metal melt temperature is the lower its surface tension. A metal melt at a temperature near its vaporization point has a critically small surface tension (almost zero). This implies that a highly super-heated metal melt can be readily atomized to nanometer-scaled droplets without requiring a high atomizing medium speed. Prior-art technologies have not taken advantage of this important feature. In actuality, it is extremely difficult, if not impossible, for prior-art atomization techniques to make use of this feature for several reasons. Firstly, the vaporization temperature of a metal is typically higher than its melting temperature by one to three thousands of degrees K. The metal melt has to be super-heated to an extremely high temperature to reach a state of very low surface tension. In a traditional atomization apparatus, it is difficult to heat a bulk quantity of metal in a crucible above a temperature higher than 3,500° C. (3,773° K.), even with induction heating. Second, in a traditional atomization apparatus, the metal melt must be maintained at such a high temperature for an extended period of time prior to being introduced into an atomizer chamber. This requirement presents a great challenge as far as protection of the metal melt against oxidation (prior to atomization) is concerned since oxidation rate is, extremely high at such an elevated temperature. Third, such a high-temperature metal melt would have a great tendency to create severe erosion to the wall of the melt-guiding pipe through which the melt is introduced into an atomizer chamber. Very few materials, if any, will be able to withstand a temperature higher than 5,500° C., for example, to be selected as a guiding pipe for refractory metal melt such as tungsten and tantalum. Fourth, the operations of pouring and replenishing a crucible with metal melt implies that the traditional atomization can only be a batch process, not a continuous process and, hence, with a limited production rate.

Further, melt atomization has been employed to produce ultra fine metallic powders, but rarely for producing ceramic (including semiconductor) powders directly. This is largely due to the fact that ceramic materials such as oxides and sulfides have much higher melting temperatures as compared to their metal counterparts and require ultra-high temperature melting facilities. Therefore, ultra fine ceramic particles are usually produced by firstly preparing ultra fine base metal particles, which are then converted to the desired ceramics by a subsequent step of oxidation, sulfidation, carbonization, and nitride formation, etc. These multiple-step processes are tedious and expensive. In solution or sol-gel type processes, atomization of precursor solutions to ceramics requires an additional step of solvent removal. Furthermore, the production rates of these processes are relatively low and the final products are expensive.

Accordingly, one object of the present invention is to provide an improved method for producing quantum-size semiconductor powder materials. The method makes use of the concepts of a more effective particle kinetic energy transfer, reduced surface tension, and efficient utilization of the released reaction heat.

Another object of the present invention is to provide a method for producing a wide range of quantum-size semiconductor particles at a high production rate.

A further object of the present invention is to provide a method for producing semiconductor quantum particles that are surface-passivated.

SUMMARY OF THE INVENTION

A preferred embodiment of the present invention entails a method for producing compound semiconductor quantum particles from at least a metallic element selected from Groups IIA, IIB, IIIA, IVA, and VA of the Periodic Table and at least a non-oxygen reactant element selected from the group consisting of P, As, S, Se, and Te. The method includes: (a) operating a heating and atomizing means to provide a stream of super-heated fine-sized fluid droplets of a selected metallic element into a reaction chamber; (b) directing a stream of a reactant element-containing fluid medium into the chamber to impinge upon and react with the super-heated metal fluid droplets to form substantially nanometer-sized phosphide, arsenide, sulfide, selenide, and/or telluride compound particles; and (c) cooling and/or passivating the compound particles to form the desired compound semiconductor quantum particles. These quantum particles are particularly useful for photo luminescence and biological labeling applications.

The method begins with super-heating a molten metal to an ultra-high temperature (e.g., higher than its melting point by 1,000 to 3,000° K.) in a droplet form and operating an atomizing means to further break up the melt droplets into nanometer-sized liquid droplets. This atomizer preferably comprises a vortex jet nozzle that receives a pressurized atomizing fluid medium from a fluid medium supplier (e.g., a compressed gas cylinder) and discharges the fluid medium through an outlet (an orifice or a multiplicity of orifices) into the atomizer chamber. This outlet is preferably annular in shape and engulfing the perimeter of the stream of super-heated metal melt droplets, i.e., coaxial with the super-heated metal fluid. The pressurized fluid medium, also referred to as the atomizing medium, is introduced through the jet nozzle to impinge upon the stream of super-heated metal droplets to further atomize the melt droplets into nanometer sizes. Alternatively, the super-heat temperatures may be selected to be sufficiently high to vaporize the metal element so that the metal is in the form of isolated atoms or small clusters (preferably smaller than 40 nm in diameter and further preferably smaller than 20 nm in diameter).

These nanometer-sized metal droplets or clusters are then allowed to rapidly react with the vapor of a reactant such as phosphorus (P), arsenic (As), sulphur (S), selenium (Se), and tellurium (Te) to form compound semiconductor particles. The heat generated by such a reaction is in turn used to sustain the reaction (hence, such a reaction is hereinafter referred to as a self-sustaining or self-propagating reaction). During such a reaction, the sizes of these nano particles can be further reduced. The resulting quantum particles, in a liquid or vapor state, are rapidly cooled and/or surface-passivated with an organic or inorganic surface-coating agent and then collected as solid powders preferably in a powder classifier system that features at least a cyclone and a device for separating exhaust gases from solid particles.

The heating and atomizing means preferably includes a thermal spray device selected from the group consisting of an arc spray device, a plasma spray device, a gas combustion spray device, an induction heating spray device, a laser-assisted spray device, and combinations thereof. Further preferably, the thermal spray device is a twin-wire arc spray device. The twin-wire arc spray process, originally designed for the purpose of spray coating, can be adapted for providing a continuous stream of super-heated metal melt droplets. This is a low-cost process that is capable of readily heating up the metal wire to a temperature as high as 6,000° C. A pressurized carrier gas is introduced to break up the metal melt into fine liquid droplets or vapor clusters. In an electric arc, the metal is rapidly heated to an ultra-high temperature and is broken up essentially instantaneously. Since the wires can be continuously fed into the arc-forming zone, the arc spray is a continuous process, which means a high production rate of ultra-fine powders.

The super-heated metal liquid droplets are preferably heated to a temperature at least 1.5 times the melting point of the metal when expressed in terms of degrees Kelvin. Further preferably, the super-heated metal liquid droplets are at a temperature at least 3.0 times the melting point of the metal when expressed in terms of degrees Kelvin. This could mean a temperature as high as 6,000° C. to ensure that the metal melt has a very small surface tension or is essentially vaporized. This is readily achieved by using a thermal spray nozzle in the practice of the present invention. In contrast, in a prior-art atomizer system, it is difficult to use a furnace or induction generator to heat a crucible of metal to a temperature higher than 2,500° C.

The presently invented process is applicable to essentially all metallic materials, including pure metals and metal alloys. However, for quantum dot applications of compound semiconductor materials, the metal elements in Groups IIA, IIB, IIIA, IVA, and VA of the Periodic Table are preferred substances for use in the practice of the present invention. These elements include Mg, Ca, Sr, Ba, Zn, Cd, Hg, Al, Ga, In, Ti, Ge, Sn, Pb, Sb, and Bi. The reactant elements, P, As, S, Se, or Te, alone or in combination, are directed to react with the metal droplets or clusters to form the desired compound semiconductor in an ultra-high temperature environment.

Preferably, the heating and atomizing means comprises a vortex jet nozzle for a more efficient atomization action. Preferably the atomizing fluid medium includes a noble gas such as argon or helium to provide a protective atmosphere against oxidation in the reaction chamber.

In another preferred embodiment, the method entails the utilization of a heating means to provide a super-heated metallic element (e.g., Cd) and operation of a combined atomizing and reacting means. In this case, the atomizing fluid contains the vapor of a reactant element (e.g., S or Se). The atomizing fluid not only serves to atomize the super-heated metal to form fine liquid metal droplets, but also allows the reactant element to rapidly react with the super-heated metal droplets to form quantum-size compound semiconductor-droplets (e.g., CdS or CdSe). If the atomizing fluid contains a mixture of two or more reactive gases (e.g., S and Se), the resulting product will contain a mixture of compounds (e.g., CdS, CdSe, and/or $CdS_xSe_{1-x}$). If the metal melt is a metal alloy or mixture (e.g., containing both Cd and Zn elements) and the reactive element is sulphur, the resulting product will contain quantum-size CdS and ZnS particles.

At the ultra-high temperature (1,000 to 2,000° K. above the metal melting point or 1.5 to 3.0 times of the melting point using absolute Kelvin scale), the surface tension of the metal melt is negligibly small and the liquid stream can be readily broken up into ultra-fine droplets. At such a high temperature, metal melt is normally capable of initiating a substantially spontaneous reaction with a reactant species (e.g., S) contained in the atomizing medium. In this case, the pressurized fluid not only possesses a sufficient kinetic energy to break up the metal melt stream into finely divided droplets, but also contains active reactant species to undergo a reaction with these fine metal droplets at high temperatures in a substantially spontaneous and self-sustaining fashion. The reaction heat released is effectively used to sustain the reactions in an already high temperature environment.

Advantages of the present invention may be summarized as follows:

1. A wide variety of quantum-sized compound semiconductor particles can be readily produced. The starting metal materials can be selected from any element in the Groups IIA, IIB, IIIA, IVA, and VA of the Periodic Table. The corresponding partner gas reactants may be selected from the group consisting of P, As, S, Se, Te and combinations thereof. No known prior-art technique is so versatile in terms of readily producing so many different types of quantum semiconductor powders.

2. The presently invented process makes use of the concept that a metal melt, when super-heated to an ultra-high temperature (e.g., reaching 1.5 to 3.0 times its melting temperature in degrees K) has a negligibly small surface tension so that a melt stream can be easily broken up into nano-scaled clusters or droplets without involving expensive or heavy atomizing nozzle equipment that is required to create an ultra-high medium speed. Prior-art atomization apparatus featuring a crucible for pouring metal melt into a melt-guiding pipe are not capable of reaching such a high super-heat temperature and/or making use of this low surface tension feature due to the four major reasons discussed earlier in the BACKGROUND section.

3. The near-zero surface tension also makes it possible to generate metal clusters of relatively uniform sizes, resulting in the formation of semiconductor powders of a narrow particle size distribution.

4. The selected super-heat temperatures also fall into the range of temperatures within which a spontaneous reaction between a metallic element and a reactant gas such as sulphur can occur. The reaction heat released is automatically used to maintain the reacting medium in a sufficiently high temperature so that the reaction can be self-sustaining until completion. The reaction between a metal and certain gas reactant (e.g., S) can rapidly produce a great amount of heat energy, which can be used to drive other reactions that occur concurrently or subsequently when other reactant elements (e.g., Te) are introduced.

5. The process involves integration of super-heating, atomizing, and reacting steps into one single operation. This feature, in conjunction with the readily achieved super-heat conditions, makes the process fast and effective and now makes it possible to mass produce nano-sized semiconductor particles cost-effectively.

6. The apparatus needed to carry out the invented process is simple and easy to operate. It does not require the utilization of heavy and expensive equipment. Further, the feeding of metallic wire in a twin-wire arc machine is a continuous process. Hence, the over-all product costs are very low.

DETAILED DESCRIPTION OF PREFERRED EMBODIMENTS

Figure 1A:
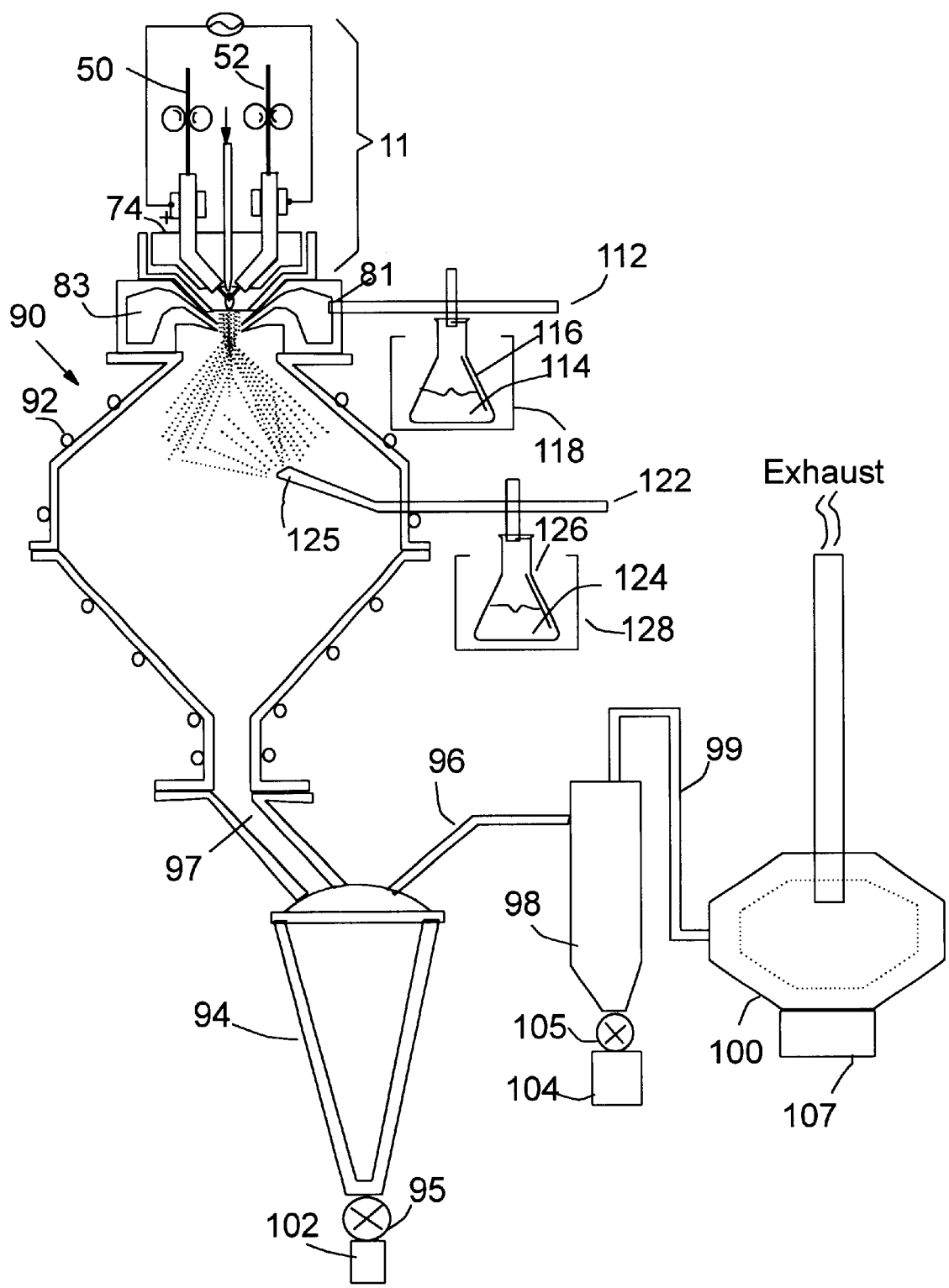
FIG. 1(A) showing the schematic of an apparatus for producing quantum-sized compound semiconductor in accordance with a preferred embodiment of the presently invented method, (B) enlarged version of the top portion of (A), and (C) showing another preferred embodiment of the method wherein the atomizing fluid medium also contains a reactant element to react with the produced nanometer-sized metal fluid droplets.
Figure 1B:
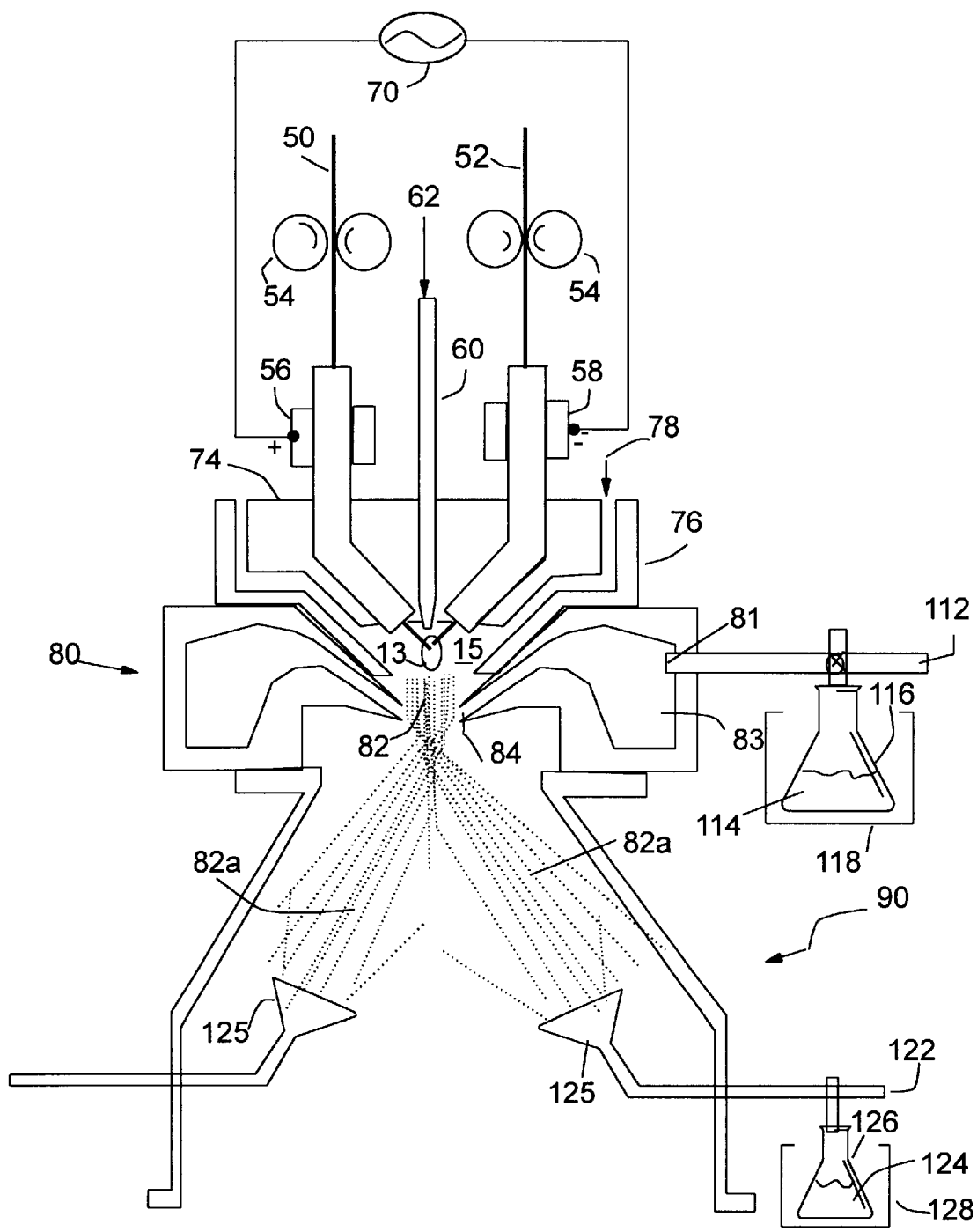

FIG. 1A and FIG. 1B schematically show an apparatus for producing quantum-sized compound semiconductor particles, in accordance with a preferred embodiment of the present invented method. This apparatus includes three major functional component systems: (1) a heating and atomizing means 11 to produce ultra-fine, highly super-heated metal liquid droplets or vapor clusters, (2) a means for supplying a fluid medium containing a reactant element, selected from the group consisting of P, As, S, Se, Te and combinations thereof, to impinge upon and react with the super-heated metal droplets or clusters to form compound semiconductor particles, and (3) means for cooling and/or passivating the resulting particles to obtain the desired solid compound semiconductor quantum particles.

In the heating and atomizing means, there provided heating means for melting a metallic material (normally supplied in a wire, rod, or powder form) and for super-heating the metal melt to a temperature normally at least 1000 degrees Kelvin above the melting point of the metal. Also provided is an atomizing means for breaking up the super-heated metal melt into ultra-fine liquid droplets (smaller than 40 nm in diameter, preferably smaller than 20 nm, and most preferably smaller than 10 nm). In a preferred embodiment of the present invention, as indicated in FIG. 1A and FIG. 1B, the heating and atomizing means includes a twin-wire electric arc spray nozzle, which is mainly comprised of an electrically insulating block 74, two feed wires 50, 52 and an atomizing device containing an atomizing gas passage means 78. The two metal wires 50,52 are supplied with a DC voltage (one "+" and the other "−") or a pulsed power 70 to form an arc 13 in an arc chamber 15. This arc 13, being at an ultra-high temperature (up to 6,000° C.), functions to melt the wire tips and super-heat the resulting metal melt. A stream of atomizing/carrier gas passes through the passage means 78 into the arc chamber 15 to atomize the metal melt (breaking up the melt into ultra-fine liquid droplets) and to carry the stream of metal liquid droplets downward toward the top portion of a reaction chamber 90.

The two wires 50,52 can be fed through air-tight means 5a,5b into the arc chamber 15, continuously or intermittently on demand, by a wire-feeding device (e.g., powered rollers 54 as indicated in FIG. 1B). The atomizing device is operated in such a fashion that it provides a stream of liquid droplets or vapor clusters that are as highly super-heated and as finely divided as possible. The speed of a stream of arc-forming gas (through 60 from 62) cannot be too high due to the fact that the gas comes in direct contact with the arc 13. Too high a gas speed in this stream could adversely affect the quality of the arc, e.g., may tend to diminish or extinct the arc. The speed of the atomizing gas coming from 78 can be much greater for more effective atomization.

The reactant gas supplier means 80 has a nozzle orifice 84 that is strategically positioned and oriented with respect to the super-heated metal droplets or clusters 82 so that a reactant gas coming from a chamber 83 can rapidly react with these super-heated droplets or clusters to form compound semiconductor particles. A selected reactant element 114 in a container 116 is heated by a heater 118 to become vaporized or sublimed into a vapor phase that is carried by a carrier gas from a source (not shown) through a pipe means 112 into the chamber 83 through an exit orifice 81. Preferably, this reactant gas supplier means is itself also an atomizing means (such as a vortex jet atomizer that has a gas accelerating chamber or channel 83 and a nozzle 84), so that the super-heated metal liquid droplets can be further broken up into quantum sizes.

The nanometer-sized compound semiconductor particles are directed to enter the top portion of a reaction chamber 90. These individual particles 82a, remaining in a liquid or vapor state at high temperatures, could aggregate or stick together if left alone. It is therefore desirable to employ a solid powder formation facilitator means (cooling and/or passivating means) to help the particles solidify and remain separated from one another. The powder facilitator means may include blowing a cooling medium (e.g., cool inert gas) through pipe means 122 and sprayer 125 to impinge upon the particles 82a. The cooling means may also include copper or steel tubing 92 (FIG. 1A) or channels, containing cooling water, that are jacketed around the atomizer chamber 90 to facilitate solidification of the particles 82A therein for forming solid powders. These powders, along with the residual atomizing gases and cooling gas are transferred through a conduit 97 to a powder collector/separator system.

The passivating means may comprise a passivating material 124 inside a container 126 which is heated to a vapor state. The vapor is transported by a carrier gas from 122 to enter the reaction chamber 90 and be sprayed out of the sprayer 125 to react with or coat the surface of the compound semiconductor particles 82a. The passivating material can be selected from the group consisting of an organic monomer, a low molecular weight polymer (oligomer), a metal, a non-metallic element, or a combination thereof. The metallic material is preferably selected from Group IIB, IIIA, IVA, and VA of the Periodic Table. The non-metallic element is preferably selected from the group consisting of P, As, S, Se, Te, or a combination thereof. Another preferred class of passivating materials contains phosphide, sulfide, arsenide, selenide, and telluride that is vaporized to deposit as a thin coating on the compound semiconductor particles 82a. The passivated semiconductor particles not only have a higher tendency to remain isolated (not to agglomerate together), but also have a higher quantum yield when used as a photoluminescent material. The latter phenomenon is presumably due to a dramatic reduction in the surface electronic energy states that would otherwise tend to result in a non-radiative electronic process.

For instance, passivation can be achieved by reaction of the surface atoms of the quantum dots with organic passivating ligands, so as to eliminate the surface energy levels. The CdSe nano crystallites can be capped with organic moieties such as tri-n-octyl phosphine (TOP) and tri-n-octyl phosphine oxide (TOPO). Passivation of quantum dots can also be achieved by using inorganic materials. Particles passivated with an inorganic coating are more robust than organically passivated dots and have greater tolerance to processing conditions necessary for their incorporation into devices. Examples of inorganically passivated quantum dot structures are CdS-capped CdSe, CdSe-capped CdS;, ZnS grown on CdS, ZnS on CdSe, CdSe on ZnS, and ZnSe on CdSe.

As schematically shown in FIG. 1A, the powder-gas mixture effluent transferred from the conduit 97 flows into the chamber of a cyclone or vortex powder classifier 94, which is provided with a reverse flow capability. With a feeder valve 95 being open, the coarse particles are collected in container 101. Finer particles along with the residual gas are fed into the chamber 98 of another cyclone which collects fine particles through a valve 105 into a container 104. The residual ultra-fine particles and gas are conveyed through a conduit 99 into a dust collector 100 which has a container 107 to collect the dusts (ultra-fine powders), allowing the clean air to exhaust out.

Figure 1C:
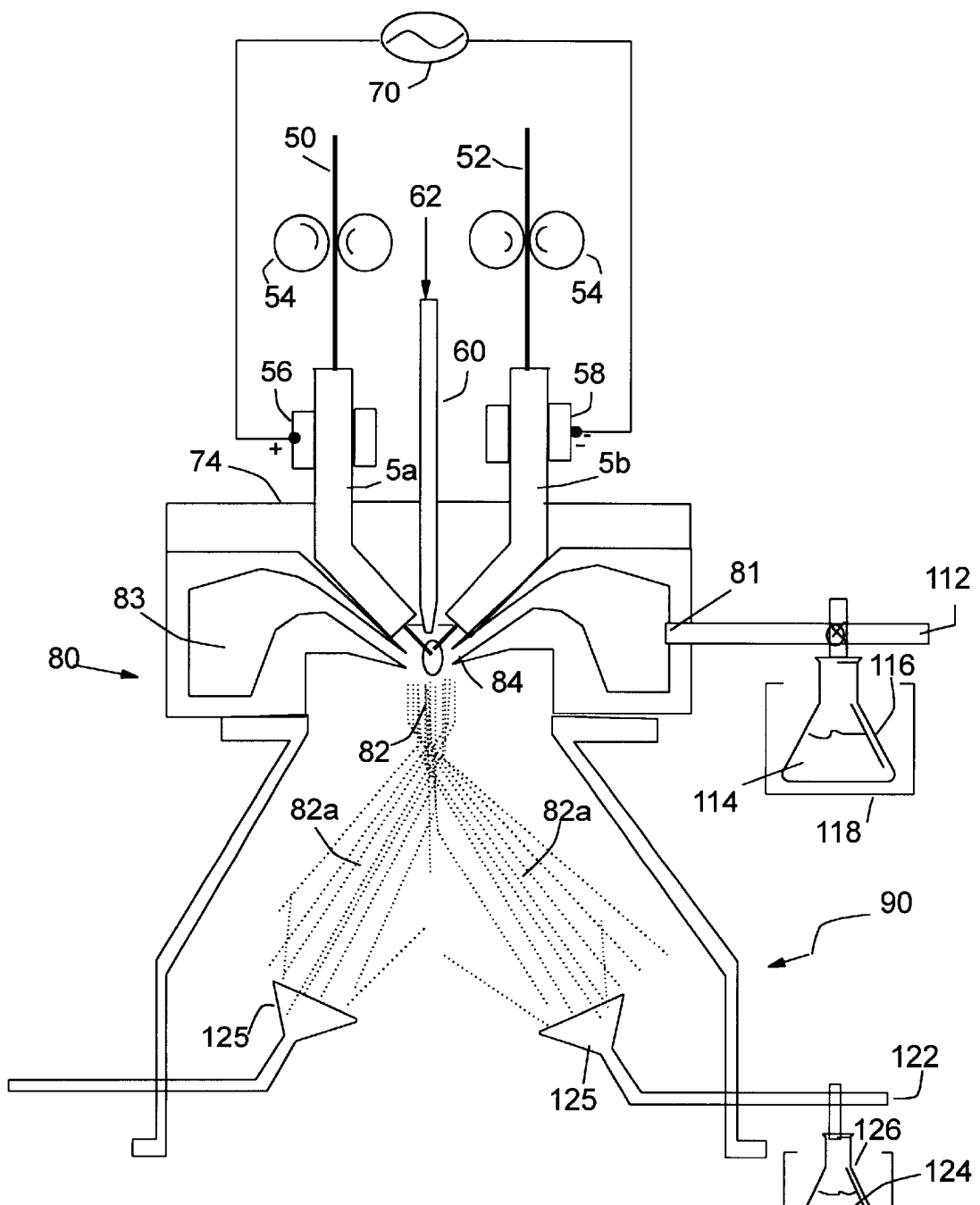

An alternative preferred embodiment of the present invention is a method that includes a different sequence of steps. Specifically, referring to FIG. 1C, the method begins with (a) operating a heating means to generate super-heated fluid droplets of at least a metallic element (selected from Groups IIA, IIB, IIIA, IVA, and VA of the Periodic Table) in a reaction chamber, which is followed by (b) directing a stream of a reactant fluid medium comprising at least a reactant element (e.g., P, As, S, Se, and/or Te) into this reaction chamber to concurrently atomize and react with the super-heated metal fluid droplets to form substantially nanometer-sized phosphide, arsenide, sulfide, selenide, and/or telluride compound semiconductor particles. The method ends with the step of cooling and/or passivating these compound particles to form the desired compound semiconductor quantum particles in a solid state. In this alternative method, atomization and reaction are combined into one step. The reactant element vapor originated from 114 in container 116 is conveyed by a pressurized carrier gas (also an atomizing gas) and introduced into the channel 83 of a vortex jet atomizer 83. The atomizing/reacting gas mixture that exits at the orifice 84 acts to concurrently atomize and reacts with the super-heated liquid droplets created by the arc. The resulting compound semiconductor quantum particles are then cooled and/or passivated and collected.

The twin-wire arc spray nozzle is but one of the many devices that can be used as a heating and atomizing means. Other types of thermal spray devices that can be used in the practice of the present invention include a plasma spray device, a gas combustion spray device, an induction heating spray device, a laser-assisted spray device, and combinations thereof. An electric arc spray nozzle, particularly a twin-wire arc spray nozzle, is a preferred choice, however. The twin-wire arc spray nozzle, originally developed for use in a spray coating process, can be adapted for providing a continuous stream of super-heated metal melt droplets. This low-cost process is capable of readily heating up the metal wire to a temperature as high as 6,000° C. and is further illustrated in FIG. 2A and FIG. 2B.

Figure 2A:
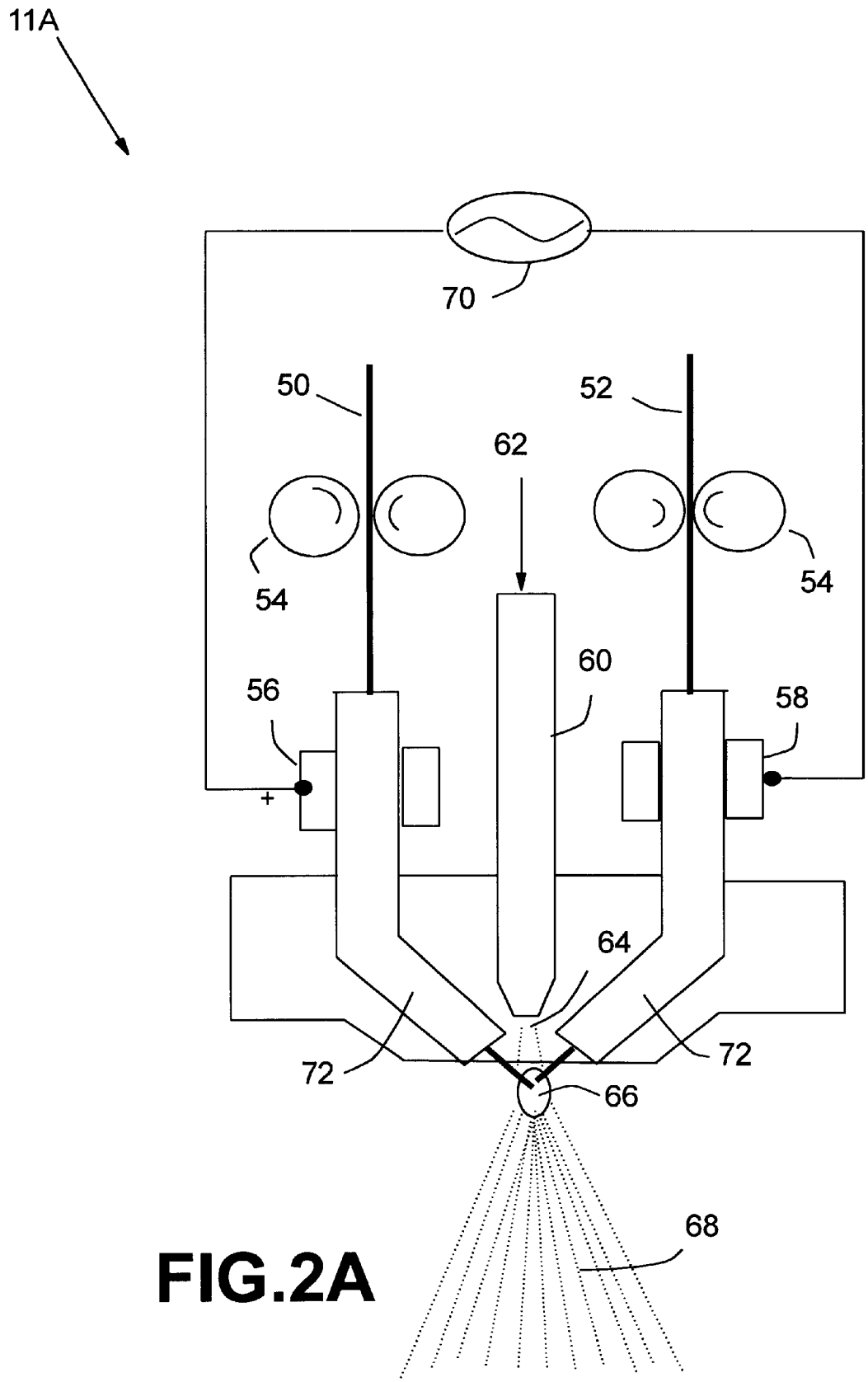
FIG. 2 schematically shows the working principle of an electric arc spray-based device for generating a stream of highly super-heated fine metal liquid droplets or vapor clusters (two examples of the heating and atomizing means): (A) an open-style arc-spray nozzle and (B) a closed-style arc-spray nozzle in which the arc zone is enclosed by an air cap 76.

Schematically shown in FIG. 2A is an open-style twin-wire arc spray nozzle 11A. Two metal wires 50,52 are driven by powered rollers 54 to come in physical contact with two respective conductive jackets 72 which are supplied with "+" and "−" voltage or pulsed power through electrically conductive blocks 56 and 58, respectively. The voltage polarity may be reversed; i.e. "−" and "+" instead of "+" and "−". The voltages come from a DC or pulsed power source 70. The lower ends of the two wires approach each other at an angle of approximately 30–60°. The two ends are brought to contact each other for a very brief period of time. Such a "short circuit" contact creates an ultra-high temperature due to a high current density, leading to the formation of an arc 66. A stable arc can be maintained provided that the voltage is constantly supplied, a certain level of gas pressure is maintained, and the wires are fed at a constant or pulsating speed. A stream 64 of compressed air, introduced through a gas passage 60 from a gas source 62 (e.g., compressed air bottle, not shown), serves to break up the melt produced inside the arc zone 66 to become finely divided metal melt droplets 68, which remain highly super-heated (i.e., at a temperature much higher than the melting point of the metal, typically by at least 1,000° in Kelvin scale).

Figure 2B:
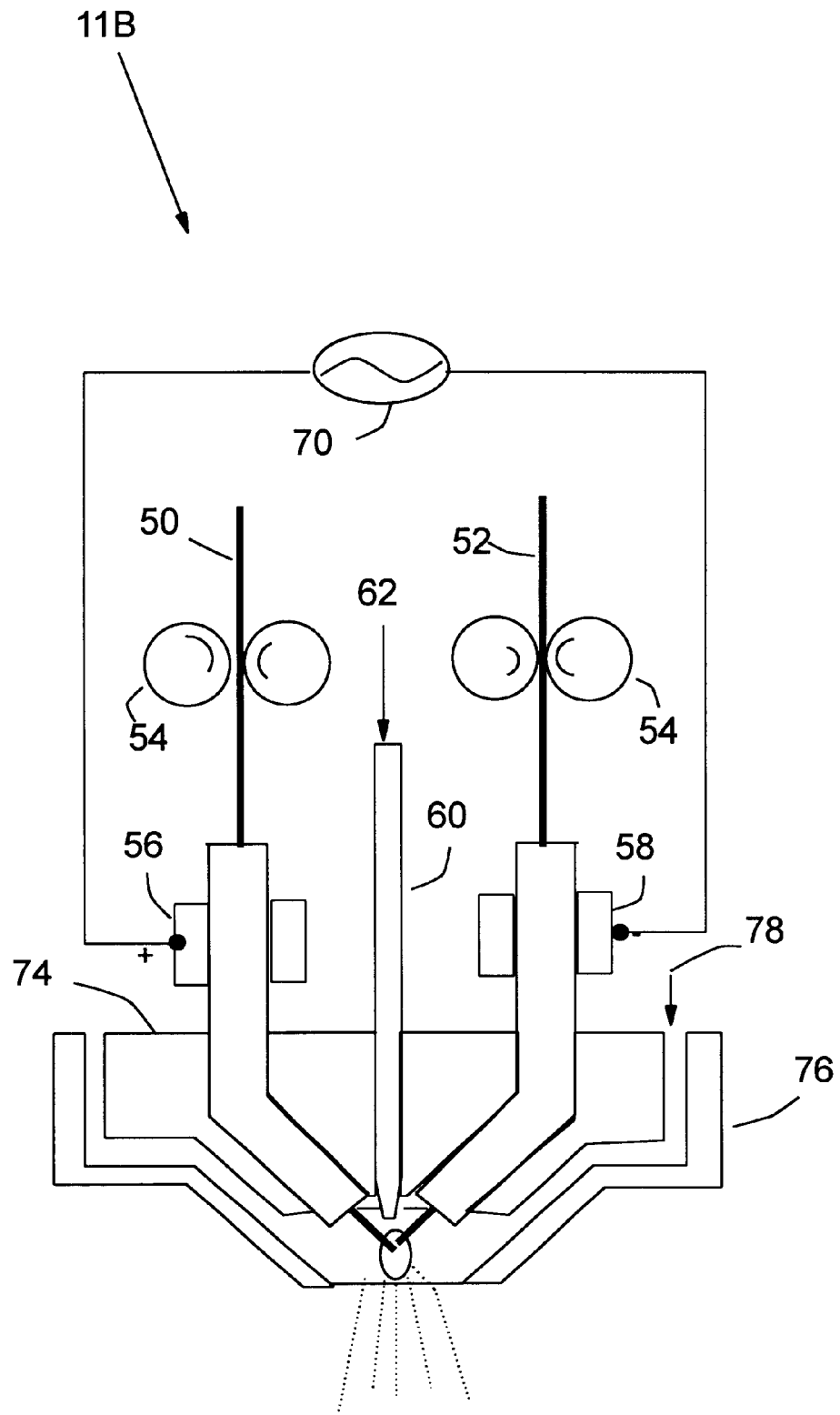

The metal melt droplets produced by the above-described open-style twin-wire arc spray nozzle tend to be high in diameter. An improved version is a closed-style arc spray nozzle 11B as schematically shown in FIG. 2B. In this spray arc nozzle, the arc zone is enclosed by an air cap 76 and additional compressed gas or air (referred to as the secondary atomizing gas) is introduced (e.g., from 78) into the arc zone to compress the arc. The increased arc zone pressure effectively increases the atomizing speed and the arc temperature, thereby promoting the more efficient atomization resulting in much finer liquid droplets. These super-heated fine liquid droplets can be optionally further atomized by a vortex jet atomizer 83 (FIG. 1A).

Figure 3:
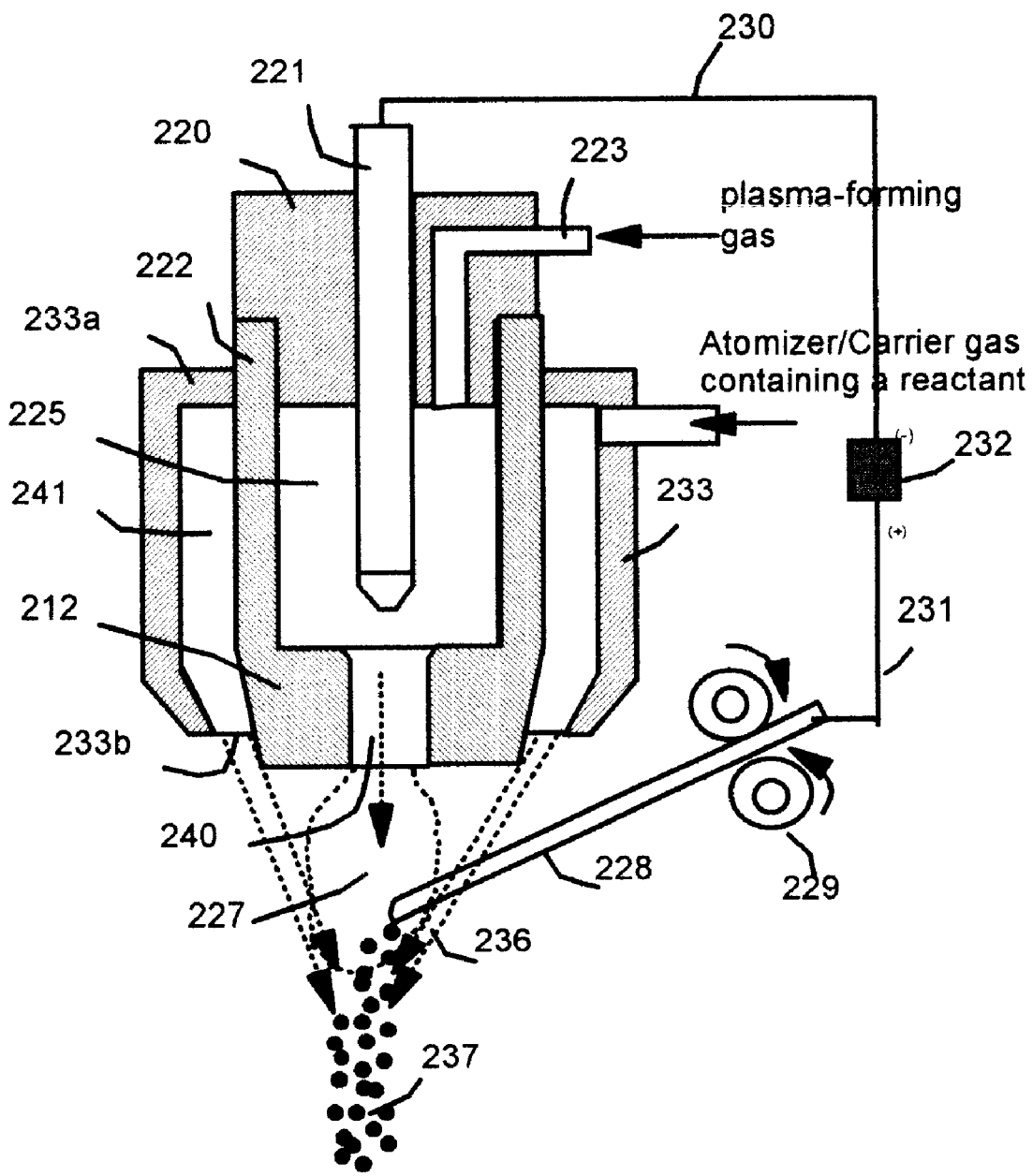
FIG. 3 a plasma spray nozzle as another example of the heating and atomizing means.

Other types of thermal spray devices that can be used in the present invention include a plasma arc spray nozzle. FIG. 3 shows an example of a plasma spray nozzle that involves feeding a wire 228 of metal (or metal powders) into the transferred arc 227 which rapidly fuses the metal for atomization. A large secondary flow of compressed air functions to atomize the molten metal into fine super-heated droplets. This plasma arc spray nozzle is comprised of the following major elements. An electrode 221 is mounted coaxially within an electrically insulating block 220 at one end of a cylindrical metal body 222, the opposite end of the body 222 is closed off by an end wall 212, provided with an axial bore forming a nozzle orifice 240. The electrode 221 is coaxial with the nozzle passage or bore, and within an annular chamber 225. A plasma-forming gas is introduced through a tube 223 to chamber 225, where the plasma-forming gas passes into and through the nozzle orifice 240. Concentrically surrounding the body 222 is a cup-shaped member 233, forming an annular space 241 between the cup-shaped member 233 and the cylindrical body 222. One end of the cup-shaped body 233 is closed off by end wall 233a, while its opposite end 233b is open. Compressed air is introduced through a tube into the annular space 241 for discharge through the open end of the cup-shaped member 233 to form a high-speed air flow 236, which functions to atomize the metal fed into the plasma arc (arc column being indicated by 227). The wire 228 is fed into the developed arc 227 by powered rollers 229 which rotate in the direction of the arrows to feed the wire. An electric potential difference is developed between the wire 228, an anode, and the electrode 221, a cathode, from a DC electric source 232 via leads 230,231 coupled respectively to the cathode 221 and the anode wire 228. The ultra-high temperature in the plasma arc (typically between 2,000° K. and as high as 32,000° K.) rapidly melts out and highly super-heat the metal, which is instantaneously atomized by the air flow 236 to become ultra-fine fluid droplets 237. These highly super-heated fluid droplets are directed to flow into a reaction chamber (not shown in FIG.3) where they are reacted with a reactant to form compound semiconductor particles. Alternatively or additionally, the atomizer-carrier gas may contain a reactant gas which reacts with atomized metal droplets or clusters to form nanometer-size compound semiconductor particles in the chamber.

At an ultra-high temperature (e.g., 1,000 to 2,000° K. above the metal-melting point or 1.5 to 3.0 times of the melting point using absolute Kelvin scale), the surface tension of the metal melt is negligibly small and the liquid stream can be readily broken up into ultra fine droplets. Table 1 shows a recommended range of processing temperatures for the metal elements involved. The processing temperatures for the reactants are given at the bottom of Table 1.

TABLE 1

The atomic number, melting point (Tm), boiling point (Tb), the Tb/Tm ratio, and recommended processing temperature range of the elements involved.

| Element | At. No. | Tm, C. | Tb, C. | Tm, K. | Tb, K. | BP/MP | Process T Range, K. |
|---|---|---|---|---|---|---|---|
| Be | 4 | 1277 | 2770 | 1550 | 3043 | 1.9632 | 2550–3100 |
| Mg | 12 | 650 | 1107 | 923 | 1380 | 1.4951 | 1300–1400 |
| Al | 13 | 660 | 2450 | 933 | 2723 | 2.9185 | 2000–2750 |
| Ca | 20 | 838 | 1440 | 1111 | 1713 | 1.5419 | 1700–1800 |
| Zn | 30 | 419.5 | 906 | 692.5 | 1179 | 1.7025 | 1100–1200 |
| Ga | 31 | 29.8 | 2237 | 302.8 | 2510 | 8.2893 | 1500–2500 |
| Ge | 32 | 937.4 | 2830 | 1210.4 | 3103 | 2.5636 | 2200–3100 |
| Sr | 38 | 768 | 1380 | 1041 | 1653 | 1.5879 | 1500–1700 |
| Cd | 48 | 320.9 | 765 | 593.9 | 1038 | 1.7478 | 1000–1100 |
| In | 49 | 156.2 | 2000 | 429.2 | 2273 | 5.2959 | 1000–2200 |
| Sn | 50 | 231.9 | 2270 | 504.9 | 2543 | 5.0366 | 1200–2500 |
| Sb | 51 | 630.5 | 1380 | 903.5 | 1653 | 1.8296 | 1500–1700 |
| Ba | 56 | 714 | 1640 | 987 | 1913 | 1.9382 | 1800–2000 |
| Hg | 80 | −38.4 | 357 | 234.6 | 630 | 2.6854 | 500–650 |
| Tl | 81 | 303 | 1457 | 576 | 1730 | 3.0035 | 1600–1750 |
| Pb | 82 | 327.4 | 1725 | 600.4 | 1998 | 3.3278 | 1600–2000 |
| Bi | 83 | 271.3 | 1560 | 544.3 | 1833 | 3.3676 | 1600–1850 |

TABLE 1-continued

The atomic number, melting point (Tm), boiling point (Tb), the Tb/Tm ratio, and recommended processing temperature range of the elements involved.

| Element | At. No. | Tm, C. | Tb, C. | Tm, K. | Tb, K. | BP/MP | Process T Range, K. |
|---|---|---|---|---|---|---|---|
| Reactants | | | | | | | |
| P | 15 | 44.2 | 280 | | | | >555 K. |
| S | 16 | 119 | 444.6 | | | | >780 K. |
| As | 33 | | 603 (Sublimation Pt.) | | | | >880 K. |
| Se | 34 | 217 | 685 | | | | >960 K. |
| Te | 52 | 449.5 | 989.8 | | | | >1265 K. |

As shown in FIG. 1B, the reactant supplier means 80 may comprise a jet nozzle having on one side inlet pipe means 81 for receiving the atomizing fluid medium from a fluid source (e.g., compressed gas bottle, not shown, and a reactant vapor from 114) and on another side a discharge orifice 84 of a predetermined size and shape through which the atomizing fluid is dispensed to impinge upon the stream of super-heated metal melt droplets 82. Preferably, the nozzle discharge orifice 84 is annular in shape and coaxial with the stream of metal melt droplets 82. The orifice outlet 84 is oriented in such a fashion that the pressurized fluid (e.g., sulphur-containing gas), immediately upon discharge from the orifice, impinges upon the super-heated metal melt stream. It may be noted that, if the atomizing gas coming out of the orifice 84 contains a reactive gas such as sulphur, the highly super-heated metal droplets can quickly react with sulphur to form sulphide particles. Since the metal sulphide formation is normally a highly exothermic process, a great amount of reaction heat is released, which can in turn be used to activate, maintain, or accelerate the sulphide formation reactions of other metal droplets. Such a self-sustaining reaction rapidly converts the liquid droplets into compound semiconductor particles.

Table 2 and Table 3 show the relative free energy of formation (ΔG) data for various compound semiconductor materials, calculated based on the heat of formation (ΔHf) and entropy of formation (ΔS) data at 298° K. (the heat and entropy data are available from "Smithells Metals Reference book", 6$^{th}$ Ed., edited by E. A. Brandes, Butterworths, 1983). The data on the free energy of formation obtained indicate that the amounts of energy released during the formation of a sulphide, selenide, telluride, and phosphide phase are respectable, although not as high as in a metal oxidation reaction. These amounts of heats were found to be sufficient to maintain a self-sustaining reaction.

TABLE 2

The heat, entropy, and free energy of formation of selected II-VI compounds. II-VI Compounds

| Compound | ΔHf (-KJ/mole) | ΔS (J/K-mole) | ΔG (-KJ/mole) |
|---|---|---|---|
| MgO | 601.6 | 26.97 | 593.56294 |
| MgS | 351.6 | 50.4 | 336.5808 |
| MgSe | 272.9 | 62.8 | 254.1856 |
| MgTe | 209.3 | 74.5 | 187.099 |
| CaO | 634.3 | 39.8 | 622.4396 |
| CaS | 476.4 | 56.5 | 459.563 |
| CaSe | 368.4 | 69.1 | 347.8082 |
| CaTe | 272.1 | 80.8 | 248.0216 |
| SrO | 592.3 | 55.5 | 575.761 |

TABLE 2-continued

The heat, entropy, and free energy of formation of selected II-VI compounds. II-VI Compounds

| Compound | ΔHf (-KJ/mole) | ΔS (J/K-mole) | ΔG (-KJ/mole) |
|---|---|---|---|
| SrS | 452.6 | 69.1 | 432.0082 |
| SrTe | 397.7 | 80.8 | 373.6216 |
| BaO | 553.8 | 70.3 | 532.8506 |
| BaS | 443.5 | 78.3 | 420.4666 |
| BaSe | 393.5 | 89.6 | 366.7992 |
| BaTe | 269.6 | 99.6 | 239.9192 |
| ZnO | 350.8 | 43.5 | 337.837 |
| ZnS | 205.3 | 57.8 | 188.0756 |
| ZnSe | 159.1 | 70.3 | 138.1506 |
| ZnTe | 119.3 | 78.2 | 95.9964 |
| CdO | 259.4 | 54.8 | 243.0696 |
| CdS | 149.4 | 69.1 | 128.8082 |
| CdSe | 144.8 | 83.3 | 119.9766 |
| CdTe | 101.8 | 93.1 | 74.0562 |
| HgO | 90.9 | 70.3 | 69.9506 |
| HgS | 53.4 | 82.5 | 28.815 |
| HgSe | 43.3 | 100.9 | 13.2318 |
| HgTe | 31.8 | 113 | −1.874 |

TABLE 3

The heat, entropy, and free energy of formation of selected III-V, III-VI, and IV-VI compounds

| | ΔHf (-KJ/mole) | ΔS (J/K-mole) | ΔG (-KJ/mole) |
|---|---|---|---|
| III-V Compounds | | | |
| GaP | 122.2 | 52.3 | 106.6146 |
| GaSb | 41.9 | 77.4 | 18.8348 |
| InP | 75.3 | 59.8 | 57.4796 |
| InSb | 31.1 | 87.7 | 4.9654 |
| AlP | 164.5 | 47.3 | 150.4046 |
| III-VI Compounds | | | |
| InSe | 118 | 81.6 | 93.6832 |
| InTe | 72 | 105.7 | 40.5014 |
| IV-VI Compounds | | | |
| SnO | 286.4 | 56.5 | 269.563 |
| SnS | 108.4 | 77 | 85.454 |
| SnSe | 88.7 | 86.2 | 63.0124 |
| SnTe | 60.7 | 98.8 | 31.2576 |
| PbO | 219.4 | 66.3 | 199.6426 |
| PbS | 98.4 | 50.4 | 83.3808 |
| PbSe | 99.6 | 102.6 | 69.0252 |
| PbTe | 69.1 | 110.1 | 36.2902 |

As a preferred embodiment, the jet nozzle may be a vortex-loop-slot jet nozzle for a more 40 efficient atomization action. A pressurized gas may be introduced from a compressed air source through one or more inlet pipes (e.g., 81) into a vortex chamber 83 in which the gas molecules swirl around several circles before finally entering the annular slit leading to the orifice 84. This configuration allows the pressurized fluid (the atomizing medium) to effectively transfer the kinetic energy of the high speed fluid molecules to the stream of liquid metal droplets 82. A variety of atomizing nozzle configurations are available in the prior art. Examples include those disclosed in U.S. Pat. No. 5,656,061 (Aug. 12, 1997 to Miller, et al.), U.S. Pat. No. 5,125,57 (Jun. 30, 1992 to Anderson, et al.), and U.S. Pat. No. 3,988,084 (Oct. 26, 1976 to Esposito, et al.).

A cyclone, 94 or 98, is normally cooled (e.g., externally water chilled) to cool the powder product. As the product fluids travel through cyclones 98, the powder drops into receiver 104 with the valve 105 being open, while gaseous effluent leaves cyclone 98 through conduit 99 into a solid separation chamber (e.g., a dust collector 100 or a wet scrubber). The wet scrubber can be a caustic water scrubber, containing packing of balls, saddles, etc. for greater contact. The scrubber separates the fine solid particles from the gas stream and possibly neutralizes acidic species therein before the gas is discharged to the atmosphere or to a flue. Any additional filtering device such as a bag filter, electrostatic precipitator or other equivalent means for separating suspended solids from a gas may be used. While only two cyclones and one solid separator are shown, more than two cyclones can be used. Alternatively, other types of powder collector and/or separator devices may be used. Solid powder collector and solid-gas separator systems are widely available in industry. Some examples are given in U.S. Pat. No. 4,282,195 (Aug. 4, 1981 to Hoekje), U.S. Pat. No. 4,490,162 (Dec. 25, 1984 to Davis), and U.S. Pat. No. 6,042,628 (Mar. 28, 2000 to Nishikiori, et al.).

What is claimed:

1. A method for producing compound semiconductor quantum particles from at least a metallic element selected from Groups IIA, IIB, IIIA, IVA, and VA of the Periodic Table and at least a non-oxygen reactant element selected from the group consisting of P, As, S, Se, and Te, said method comprising:
   (a) operating a heating and atomizing means to provide a stream of super-heated fine-sized fluid droplets of said at least a metallic element into a reaction chamber;
   (b) directing a stream of a reactant fluid medium comprising said at least a reactant element into said chamber to impinge upon and react with said stream of super-heated metal fluid droplets to form substantially nanometer-sized phosphide, arsenide, sulfide, selenide, and/or telluride compound particles; and
   (c) cooling and/or passivating said compound particles to form said compound semiconductor quantum particles in a solid state.

2. The method as set forth in claim 1, wherein said heating and atomizing means comprises a thermal spray device selected from the group consisting of an arc spray device, a plasma spray device, a gas combustion spray device, an induction heating spray device, a laser-assisted spray device, and combinations thereof.

3. The method as set forth in claim 2, wherein said thermal spray device comprises a twin-wire arc spray device.

4. The method as set forth in claim 1, wherein said super-heated metal fluid droplets are at a temperature at least 1.5 times the melting point of said metal when expressed in terms of degrees Kelvin.

5. The method as set forth in claim 4, wherein said super-heated metal fluid droplets are at a temperature at least three times the melting point of said metal when expressed in terms of degrees Kelvin.

6. The method as set forth in claim 1, wherein said super-heated metal fluid droplets include nanometer-sized vapor atom clusters of said metal.

7. The method as set forth in claim 1, wherein said super-heated fluid droplets include nanometer-sized liquid atom clusters of said metal.

8. The method as set forth in claim 1, wherein said step of operating a heating and atomizing means comprises operating an arc or plasma spray gun to super-heat said metal and concurrently directing a stream of pressurized gas into said chamber to impinge upon said super-heated metal for generating said stream of super-heated fluid droplets.

9. The method as set forth in claim 1, wherein said heating and atomizing means comprises a vortex jet atomizer.

10. The method as set forth in claim 1, further comprising a step of collecting said cooled and/or passivated compound semiconductor particles in a powder collector means comprising a cyclone.

11. The method as set forth in claim 10, further comprising a step of separating exhaust gases from solid semiconductor particles.

12. The method as set forth in claim 1, wherein said at least a metal comprises at least two metallic elements.

13. The method as set forth in claim 1, wherein said stream of a reactant fluid medium comprises said reactant element in vapor form.

14. The method as set forth in claim 13, wherein said reactant element vapor is directed into said chamber by a carrier gas.

15. The method as set forth in claim 1, wherein the reaction in step (b) between said super-heated fine metal fluid droplets and said at least a reactant is operated in such a manner that the reaction heat released is used to sustain said reaction until most of said metal fluid droplets are substantially converted to nanometer-sized compound semiconductor particles.

16. The method as set forth in claim 1, wherein said passivating step comprises coating the surface of said compound semiconductor particles with a thin film of a protective material selected from the group consisting of a polymer, carbon, organic, metallic, semiconductor, glass, insulator, and combinations thereof.

17. A method for producing compound semiconductor quantum particles from at least a metallic element selected from Groups IIA, IIB, IIIA, IVA, and VA of the Periodic Table and at least a non-oxygen reactant element selected from the group consisting of P, As, S, Se, and Te, said method comprising:
   (a) operating a heating means to generate super-heated fluid droplets of said at least a metallic element in a reaction chamber;
   (b) directing a stream of a reactant fluid-medium comprising said at least a reactant element into said chamber to concurrently atomize and react with said super-heated metal fluid droplets to form substantially nanometer-sized phosphide, arsenide, sulfide, selenide, and/or telluride compound semiconductor particles; and
   (c) cooling and/or passivating said compound particles to form said compound semiconductor quantum particles in a solid state.

18. The method as set forth in claim 17, wherein said heating means comprises a thermal spray device selected from the group consisting of an arc spray device, a plasma spray device, a gas combustion spray device, an induction heating spray device, a laser-assisted spray device, and combinations thereof.

19. The method as set forth in claim 17, wherein said reactant fluid medium is pre-heated to a predetermined temperature prior to being introduced to impinge upon said metal fluid droplets.

20. The method as set forth in claim 17, wherein said step of operating a heating means comprises operating an arc or plasma spray gun to super-heat said metal and said step of directing a stream of a reactant fluid medium comprises directing a stream of pressurized gas containing said reactant element into said chamber to impinge upon said super-heated metal.

21. The method as set forth in claim 17, further comprising a step of collecting said cooled and/or passivated compound semiconductor particles in a powder collector means.

22. The method as set forth in claim 17, wherein the reaction in step (b) between said super-heated fine metal fluid droplets and said at least a reactant is operated in such a manner that the reaction heat released is used to sustain said reaction until most of said metal fluid droplets are substantially converted to nanometer-sized compound semiconductor particles.

23. The method as set forth in claim 17, wherein said passivating step comprises coating the surface of said compound semiconductor particles with a thin film of a protective material selected from the group consisting of a polymer, carbon, organic, metallic, semiconductor, glass, insulator, and combinations thereof.

* * * * *